United States Patent
Bostyn et al.

(10) Patent No.: US 10,385,606 B2
(45) Date of Patent: Aug. 20, 2019

(54) INTELLIGENT AUTOCLOSE DOOR

(71) Applicant: Entrematic Belgium NV, Moorsel (BE)

(72) Inventors: Frederic Bostyn, Moorsel (BE); Charles Fauquette, Moorsel (BE); Bruno Viseur, Moorsel (BE)

(73) Assignee: ENTREMATIC BELGIUM NV, Moorsel (BE)

( * ) Notice: Subject to any disclaimer, the term of this patent is extended or adjusted under 35 U.S.C. 154(b) by 135 days.

(21) Appl. No.: 15/520,543

(22) PCT Filed: Oct. 16, 2015

(86) PCT No.: PCT/EP2015/074050
§ 371 (c)(1),
(2) Date: Apr. 20, 2017

(87) PCT Pub. No.: WO2016/066456
PCT Pub. Date: May 6, 2016

(65) Prior Publication Data
US 2017/0314319 A1    Nov. 2, 2017

(30) Foreign Application Priority Data
Oct. 27, 2014   (BE) .................................. 2014/5031

(51) Int. Cl.
*E05F 15/73*       (2015.01)
*H01L 33/44*       (2010.01)
(Continued)

(52) U.S. Cl.
CPC .............. *E05F 15/73* (2015.01); *E05F 15/40* (2015.01); *E06B 9/11* (2013.01); *E06B 9/171* (2013.01);
(Continued)

(58) Field of Classification Search
None
See application file for complete search history.

(56) References Cited

U.S. PATENT DOCUMENTS 3,285,369 A * 11/1966 Hornung ................. B66B 13/26
                                                         187/317
4,035,702 A *  7/1977 Pettersen ................. E05F 15/79
                                                         318/256
(Continued)

FOREIGN PATENT DOCUMENTS

CN     101730781     6/2010
CN     102409920     4/2012
EP     0344404 A1   12/1989

OTHER PUBLICATIONS

1st Office Action mailed in corresponding CN 201580057992.4 dated Aug. 2, 2018 (7 pages).
(Continued)

*Primary Examiner* — Catherine A Kelly
(74) *Attorney, Agent, or Firm* — Wissing Miller LLP

(57) ABSTRACT

The present invention concerns an auto-close door for closing an area (3) at least partially defined by a frame, said auto-close door comprising: A) A motorized driving mechanism (10) suitable for moving a leading edge (1L) of a shutter (1) in a first direction (α) to close said area defined within said frame and in a second direction (β) to open said area; B) Wave detection cells (5) suitable for detecting the presence of an obstacle within the area defined by the frame; and/or C) In addition or alternatively, an impact detector (6) suitable for detecting an impacting event with a leading edge of the shutter, D) A processing unit (CPU) programmed to carry out the following operations: a) Upon opening the area a first time by moving the leading edge of the shutter in said second direction (β), maintain the area open for an opening time (t1), after which b) close the shutter, c) Record whether
(Continued)

an obstacle and/or an impacting event is detected by the wave detector or the impact detector, upon closing the shutter; d) Count the number (n), of obstacles and/or impacting events detected during a number (N), of repetitions of the cycle defined by steps (a) to (c), and if $n/N > v_{ref,1}$, wherein, $v_{ref,1}$, is a first control ratio, then the opening time (t1), is prolonged to a time, $t2 = t1 + \Delta t2$, wherein $\Delta t2 > 0$; (e) Repeat steps (a) to (d) with the values t1 or t2 determined in step (d).

11 Claims, 5 Drawing Sheets

(51) Int. Cl.
| | |
|---|---|
| *H01L 33/48* | (2010.01) |
| *H01L 33/54* | (2010.01) |
| *H01L 33/62* | (2010.01) |
| *H01L 33/50* | (2010.01) |
| *E05F 15/40* | (2015.01) |
| *E06B 9/11* | (2006.01) |
| *E06B 9/171* | (2006.01) |
| *H01L 25/075* | (2006.01) |
| *H01L 25/16* | (2006.01) |
| *H01L 33/56* | (2010.01) |
| *E06B 9/68* | (2006.01) |

(52) U.S. Cl.
CPC ............ *H01L 33/44* (2013.01); *H01L 33/486* (2013.01); *H01L 33/507* (2013.01); *H01L 33/54* (2013.01); *H01L 33/62* (2013.01); *E05F 2015/765* (2015.01); *E05Y 2400/54* (2013.01); *E05Y 2800/352* (2013.01); *E05Y 2900/10* (2013.01); *E06B 2009/6836* (2013.01); *H01L 25/0753* (2013.01); *H01L 25/167* (2013.01); *H01L 33/505* (2013.01); *H01L 33/56* (2013.01); *H01L 2224/48091* (2013.01); *H01L 2224/73215* (2013.01); *H01L 2924/181* (2013.01); *H01L 2933/0025* (2013.01); *H01L 2933/0091* (2013.01)

(56) References Cited

U.S. PATENT DOCUMENTS

| | | | | |
|---|---|---|---|---|
| 4,967,083 | A * | 10/1990 | Kornbrekke | G01S 17/026 250/221 |
| 5,001,557 | A * | 3/1991 | Begle | B66B 13/26 187/317 |
| 5,357,183 | A * | 10/1994 | Lin | E05F 15/43 318/266 |
| 5,752,343 | A * | 5/1998 | Quintus | E05F 15/79 49/29 |
| 6,075,333 | A * | 6/2000 | Huddle | E06B 9/68 318/266 |
| 6,114,956 | A * | 9/2000 | Van Genechten | G01S 13/56 340/552 |
| 6,469,464 | B1 * | 10/2002 | McCall | E05F 15/668 318/245 |
| 8,341,885 | B2 * | 1/2013 | Bostyn | E06B 9/11 49/26 |
| 9,015,994 | B2 * | 4/2015 | Lamb | E05F 15/77 49/199 |
| 2004/0216379 | A1 * | 11/2004 | Gioia | E06B 9/68 49/29 |
| 2010/0181033 | A1 | 7/2010 | Bostyn | |
| 2012/0073200 | A1 | 3/2012 | Bostyn | |
| 2013/0227886 | A1 * | 9/2013 | Kurth | E05F 15/79 49/30 |
| 2018/0181033 | A1 | 6/2018 | Minobe | |

OTHER PUBLICATIONS

International Search Report and Written Opinion mailed in corresponding PCT/EP2016/074050 dated Jan. 22, 2016.
International-Type Search Report in corresponding Belgian priority application 2014/5031 dated Jul. 24, 2015.

* cited by examiner

INTELLIGENT AUTOCLOSE DOOR

CROSS-REFERENCE TO RELATED APPLICATIONS

This application is the National Stage entry under 35 U.S.C. § 371 of International Application No. PCT/EP2015/074050 filed on Oct. 16, 2015, published on May 6, 2016 under Publication Number WO 2016/066456, which claims the benefit of priority under 35 U.S.C. § 119 of Belgian Patent Application Number 2014/5031 filed Oct. 27, 2014.

TECHNICAL FIELD

The present invention concerns auto-closes suitable for automatically closing a shutter after maintaining it open for a given opening time. It concerns, in particular, intelligent doors able to optimize the opening time as a function of the events history recorded from previous opening/closing cycles.

BACKGROUND OF THE INVENTION

Automatic doors comprising a shutter are commonly used to shut off openings, particularly to cut off warehouses or industrial halls. These shutters are often made up of large flexible tarpaulins the lateral edges of which comprise beads which slide in guiding rail situated on each side of the opening that is to be closed. Alternatively, they can be made of rigid panels hinged to one another side by side or the shutter can be a rigid panel. Automatic doors are particularly useful when they are used to separate two rooms having different environmental conditions, such as temperature, relative humidity and the like. In such conditions, the time such door remains open must be minimized to preserve the desired conditions on both sides of the door. Doors able to open and close at high speed are also known for these applications and are often referred to as "fast doors".

One issue with automatic doors, particularly with fast doors due to their high closing speed, is impacts with obstacles accidentally located within the closing trajectory of the shutter. Besides damaging the obstacle (which can be a human) such impact can damage the leading edge of the shutter and also disengage the bead of the shutter lateral edges from the guiding rail. Systems for automatically reinserting a bead thus disengaged are described e.g., in US20100181033, which disclosure is herein incorporated in its entirety by reference.

Since preventing is better than repairing, many automatic door systems are provided with obstacle and/or impact detection devices. A door provided with an obstacle detection device is described e.g., in US20030071590. A door provided with an impact detection device is described e.g., in US20120073200. In the latter, a safety procedure is described in case of an impact, including stopping the closing of the shutter, opening the shutter to a waiting position and maintaining it at such position for a predetermined waiting time after which the shutter is closed again at normal speed, and just before reaching the position of first impact, at reduced speed. In case no obstacle is detected at the first impact position, closing continues at normal speed. If, on the other hand, the obstacle is still present at the first impact position, the shutter is opened again to the waiting position. If the obstacle is still detected upon several such cycles, the shutter is opened permanently, and must be re-activated manually.

For operator's comfort, as well as for optimizing the closing of the area defined by the frame of the door, many door systems are provided with an automatic closing system, sometimes referred to as "auto-close" doors. In such systems, the door can be opened by a signal sent by an operator, but the operator needs not send a second signal to close the shutter, as it will close automatically after a given time, t. Such doors will be referred to herein as auto-close doors. The danger of impacting an obstacle is even higher with auto-close doors than with manually controlled doors, since the closing may happen in the absence of any operator in the direct neighborhood of the door.

US20030071590 discloses an auto-close door provided with an optical obstacle detecting sensor and a timer for controlling the time the door must remain open before closing. The timer is triggered only after the sensor is interrupted for at least three seconds or more by e.g., the passage of a vehicle in case of a garage door. If, during the closing of the door, an obstruction would occur, the door would return to its open position, and cannot be closed again automatically. An operator must trigger the closing of the door which remain closed for one and one-half minutes before the automatic closing mode can actuated again. This system is interesting because it matches the opening time of the door to the time of passage of a vehicle through the open frame. It is not, however, an intelligent auto-close door because it does not learn and adapt the opening time from its events history.

U.S. Pat. No. 6,924,730 discloses a fire door control system able to automatically close the door upon triggering of an alarm, such as a fire alarm. As the alarm is triggered, a timer is started for waiting a predetermined period of time, before releasing the automatic brake release. In case the door hits an obstacle upon closing, then the door will stop for a given time to allow the obstruction to be removed. Then the system the door is pulsed closed again by the clutch. The door will stop each time an obstruction is encountered. If no obstruction is encountered then the door finishes incrementally closing by the pulsating clutch. Again, this auto-close control system is not intelligent as it does not adapt the time the door remains open to the events history of the door.

EP344404 and U.S. Pat. No. 5,001,557 describe a method for controlling the position of an automatically operated elevator door as a function of the presence, number and movement conditions of one or more persons present on a support surface within a predeterminate space extending on a predetermined side of the automatically operated doo. The method provides a clear and unambiguous indication of the presence, the number and the movement conditions of the one or more persons and permit controlling the operation of the automatically operated door consistent with the indicated presence, number and movement conditions of the one or more persons. This method is advantageous for controlling elevator doors as it adapts the door opening time to each stage when the door is open as a function of the presence and movements of persons at said stage. This method is, however, not suitable for fast doors of the type used in warehouses and industrial halls, and the like because the method is designed for scanning one side only of the door, and scanning both sides would render the control of the door quite complex as the processor would have to interpret the images produced by two cameras.

The present invention provides an intelligent auto-close door capable of learning the optimal time said door must remain open prior to closing automatically. Said learning is based on a number of opening and automatic closing cycle repetitions. This and other advantages of the present invention are presented in continuation.

SUMMARY OF THE INVENTION

The present invention is defined in the appended independent claims. Preferred embodiments are defined in the dependent claims. In particular, the present invention concerns an auto-close for closing an area at least partially defined by a frame, said auto-close door comprising:
- (A) A motorized driving mechanism suitable for moving a leading edge of a shutter in a first direction to close said area defined within said frame and in a second direction to open said area;
- (B) Wave detection cells suitable for detecting the presence of an obstacle within the area defined by the frame; and/or
- (C) In addition or alternatively, an impact detector suitable for detecting an impacting event with a leading edge of the shutter,
- (D) A processing unit (CPU) programmed to carry out the following operations:
  - (a) Upon opening the area a first time by moving the leading edge of the shutter in said second direction, maintain the area open for an opening time, t1, after which
  - (b) close the shutter,
  - (c) Record whether an obstacle and/or an impacting event is detected by the wave detector or the impact detector, upon closing the shutter;
  - (d) Count the number, n, of obstacles and/or impacting events detected during a number, N, of repetitions of the cycle defined by steps (a) to (c), and if the event frequency, $n/N > v_{ref,1}$, wherein, $v_{ref,1}$, is a first control ratio, then the opening time, t1, is prolonged to a time, $t2 = t1 + \Delta t2$, wherein $\Delta t2 > 0$;
  - (e) Repeat steps (a) to (d) with the values t1 or t2 determined in step (d).

In a preferred embodiment, allowing the shortest opening time best suited to specific use conditions of an auto-close door, step (d) is further defined by:
(i) If $n/N < v_{ref,2}$, wherein, $v_{ref,2}$, is a second control ratio with $v_{ref,2} \leq v_{ref,1}$, then the opening time, t0, is reduced to a time, $t0 = t1 - \Delta t0$, wherein $\Delta t0 > 0$;
(ii) If $v_{ref,2} \leq n/N \leq v_{ref,1}$, then the opening time, t0, is maintained constant, and
in step (e), the cycle defined by steps (a) to (c) is repeated with the values t0, t1, or t2 determined in step (d).

In a preferred embodiment, a statistically representative number, $N_{min}$, of cycle repetitions defined by steps (a) to (c) must be carried out before the opening time is modified in step (e), and wherein $N_{min}$ is preferably comprised between 1 and 30 cycles, more preferably between 10 and 20 cycles.

The shutter of an auto-close door according to the present invention comprises a leading edge linking two lateral edges which are preferably engaged in parallel guiding rails defining two sides of the frame. Such guiding rails define the direction of the movement of the leading edge upon closing and opening the shutter.

Since the learning process of an auto-close door according to the present invention involves undergoing some impacts, it is advantageous if upon detection of an obstacle and/or an impacting event, an emergency procedure is initiated comprising stopping the closing of the shutter and preferably initiating the opening of the shutter to a waiting position, $P_{waiting}$. For example, if the auto-close door further comprises means for monitoring the instantaneous position of the leading edge of the shutter in its closing/opening trajectory in the direction defined by the guiding rails, the following emergency procedure can be applied:
(i) stoppage of the motor, and storage of the event position, $P_{event}$, followed by
(ii) opening of the shutter at a speed v2 as far as a waiting position, $P_{waiting}$, predetermined so as to leave sufficient space for removing the obstacle;
(iii) after a waiting time, $\Delta t_{waiting}$, in the waiting position, $P_{waiting}$, closing the shutter again at the speed, v1, as far as a predetermined position, P3, situated upstream of the event position $P_{event}$, at which point the speed of closing is reduced to the value v3, with $0 < v3 < v1$;
(iv) if upon closing the shutter at the reduced speed, v3, no obstacle is detected at the position, $P_{event}$, increasing the speed of closing to the value v1 until the shutter reaches a desired final position;
(v) if on the other hand upon closing the shutter at a reduced speed, v3, an obstacle is detected once again at the same position $P_{event}$, the cycle defined by steps (i) to (iii) is repeated and step (iv) is executed if the conditions defined therein are fulfilled;
(vi) if after a predetermined number, $N_{safe}$, of repetitions of said cycle the obstacle is still detected, opening the shutter at speed, v2, and stopping of the shutter at a predetermined stop position Pstop, until manual reactivation of the control system.

An auto-close door according to the present invention may comprise means for monitoring the instantaneous position of the leading edge of the shutter selected among the following:
  Optical device suitable for counting a number of windows aligned along at least one lateral edge of the shutter; or
  Device for counting the number of revolution of the motor driving the opening/closing of the shutter.

In a preferred embodiment, the auto-close door comprises:
at least one lateral edge of the shutter comprises a bead slideably engaged in an opening of the corresponding guiding rail (7) and which can be extracted therefrom under the action of a defined pulling force directed transversely to the guiding rail provoked for example by an impact upon closing the shutter, and wherein:
the auto-close door further comprises a means for reinserting into the guiding rail opening the bead that has been extracted therefrom, this means comprising a guide member which is positioned facing the guiding rail opening and which is designed so that, while the shutter is being opened, it deflects toward the guiding rail opening the bead that has been extracted from this guiding rail opening, wherein the guide member comprises at least one pair of rollers having fixed axes of rotation which are located symmetrically on each side of the mid-plane of the shutter, in the same plane substantially perpendicular to said mid-plane of the shutter and are directed obliquely with respect to said mid-plane of the shutter so that the rollers converge toward the bottom of the guiding rail opening and roll, as the shutter is moved in the opening direction, along the bead which has been extracted from the guiding rail opening, pushing it into the guiding rail opening.

The shutter and motorized driving mechanism may be selected from:
  (a) a flexible shutter wherein the motorized driving mechanism drives the rotation of a drum to move the leading edge in the first direction to close the area by unwinding the flexible shutter from said drum, and to move it in the second direction (β) to open said area by winding the flexible shutter about said drum;
(b) deformable shutter comprising panels hinged to one another parallel to the leading edge, wherein the motorized driving mechanism drives the rotation of an axle about which the hinged panels rotate and change direction, or
(c) A rigid shutter, wherein the motorized driving mechanism drives the rotation of an axle which moves the rigid shutter in the plane of said area in the first and second directions, preferably by means of a gear system; cables, or chains.

BRIEF DESCRIPTION OF THE FIGURES

For a fuller understanding of the nature of the present invention, reference is made to the following detailed description taken in conjunction with the accompanying drawings in which.

DETAILED DESCRIPTION OF THE INVENTION

Figure 1:
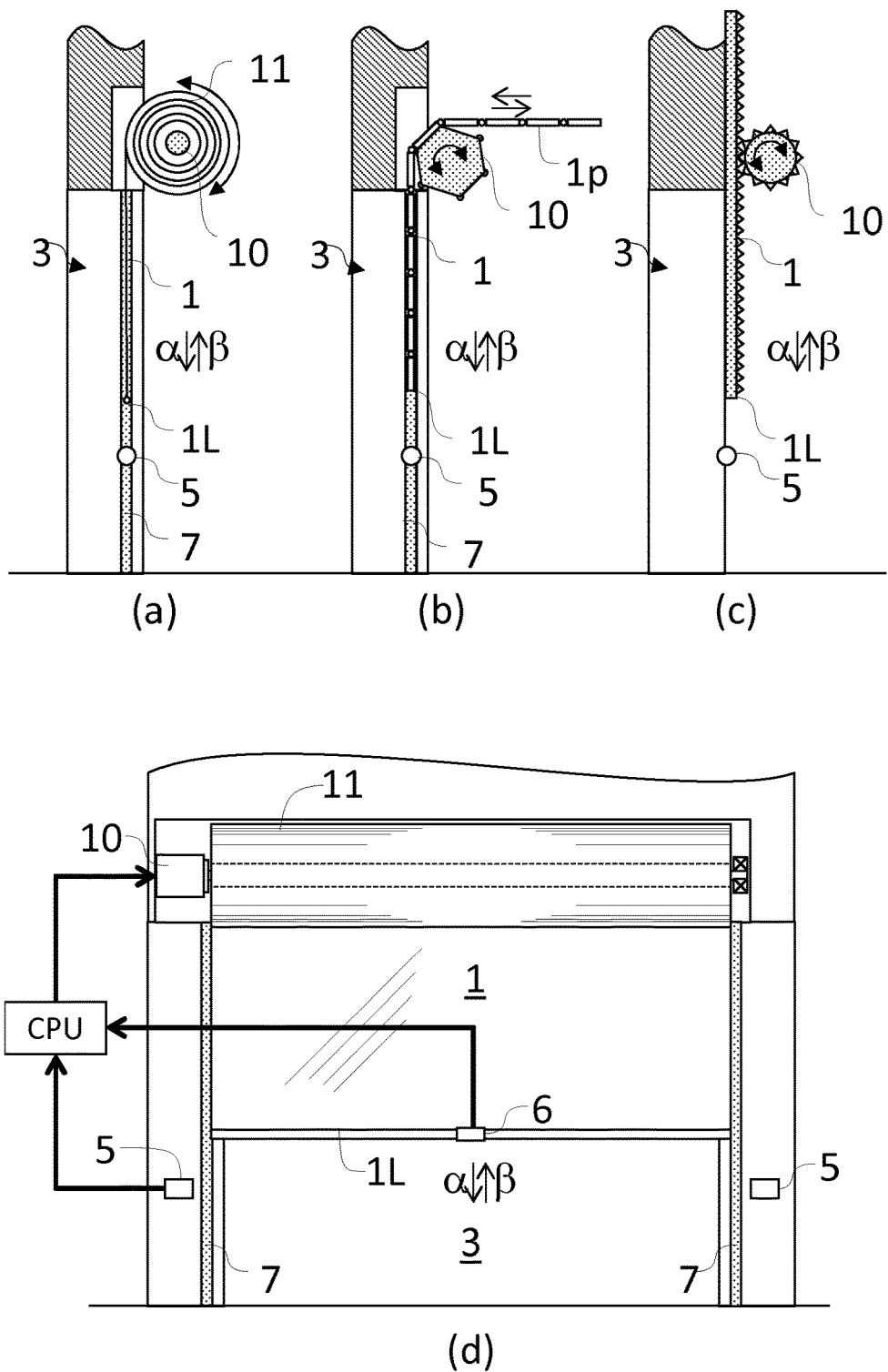
FIG. 1: shows three embodiments of auto-close doors according to the present invention.

As illustrated in FIG. 1, an auto-close door according to the present invention comprises a motorized driving mechanism (10) suitable for moving a leading edge (1L) of a shutter (1) in a first direction (α) to close said area defined within said frame and in a second direction (β) to open said area.

As shown in FIGS. 1(a)&(d) the shutter can be a flexible shutter in the form of a flexible fabric or curtain, and the motorized driving mechanism (10) drives the rotation of a drum (11) to move the leading edge (1L) in the first direction (α) to close the area by unwinding the flexible shutter from said drum, and to move it in the second direction (β) to open said area by winding the flexible shutter about said drum.

FIG. 1(b) illustrates a deformable shutter comprising rigid panels (1p) hinged to one another parallel to the leading edge (1L), wherein the motorized driving mechanism (10) drives the rotation of an axle about which the hinged panels rotate and change direction. For example, notches in the axle may cooperate with the hinges between panels to ensure a slip-free movement of the deformable shutter. Alternatively, cables or chains can be used to drive the movement of the shutter.

FIG. 1(c) shows a third type of shutter in the form of a rigid shutter, wherein the motorized driving mechanism (10) drives the rotation of an axle which moves the rigid shutter in the plane of said area in the first and second directions. A gear system is illustrated in FIG. 1(c), but any means known to a person skilled in the art for moving up and down a rigid shutter, such as cables or chains can be used without affecting the present invention.

A shutter is a surface defined by a leading edge (1L) moving up (β) and down (α), in case of a vertical area (3) as illustrated in FIG. 1, said leading edge bridging two lateral edges parallel to one another. Regardless of the type of shutter used, the lateral edges are preferably engaged in guiding rails (7) suitable for guiding the shutter in its trajectory when opening or closing the area (3). An example of an automatic door comprising lateral edges of a shutter coupled to guiding rails is given e.g., in EP0587586 or WO2008155292, the contents of which are herein incorporated by reference. Such automatic doors are particularly suitable for use in the present invention. In particular, the shutter of WO2008155292 is advantageous for the present invention as it comprises the following features:

at least one lateral edge of the shutter comprises a bead slideably engaged in an opening of the corresponding guiding rail (7) and which can be extracted therefrom under the action of a defined pulling force directed transversely to the guiding rail provoked for example by an impact upon closing the shutter, and wherein:

the auto-close door further comprises a means for reinserting into the guiding rail opening the bead that has been extracted therefrom, this means comprising a guide member which is positioned facing the guiding rail opening and which is designed so that, while the shutter is being opened, it deflects toward the guiding rail opening the bead that has been extracted from this guiding rail opening, wherein the guide member comprises at least one pair of rollers having fixed axes of rotation which are located symmetrically on each side of the mid-plane of the shutter, in the same plane Applying the present invention to a door of this type renders the learning process of the door totally autonomous, since even in case of impact and de-coupling of a lateral edge from the corresponding guiding rail, the door can get auto-repaired and resume its function without any external assistance.

An auto-close door according to the present invention must also comprise one or both of:
(a) A wave detection cell (5) suitable for detecting the presence of an obstacle within the area defined by the frame during the closing of the shutter; and/or
(b) an impact detector (6) suitable for detecting an impacting event with a leading edge of the shutter, Detection cells (5) and impact detectors (6) are well known in the art, and any model available on market can be used in the present invention. For example, detection cells (5) are described in US20030071590, and examples of impact detectors are described in US20120073200. A door according to the present invention preferably comprises at least detection cells (5).

The gist of the present invention is a central processing unit (CPU) programmed to carry out specific operations to teach a door exposed to specific use conditions, after a number of trials, what is the optimal opening time for said use conditions. If the use conditions change with time, the teaching process allows the door to adapt its opening time to said new use conditions. Note that the term "opening time" is defined herein as the time a shutter remains open before automatically closing.

The central processing unit in an auto-close door according to the present invention is programmed to carry out the following operations:

(a) Upon opening the area a first time by moving the leading edge of the shutter in said second direction (β), maintain the area open for an opening time, t1, after which
(b) close the shutter, (i.e., by moving the leading edge of the shutter in said first direction (α))
(c) Record whether an obstacle and/or an impacting event are detected by the wave detector or the impact detector, upon closing the shutter;
(d) Count the number, n, of obstacles and/or impacting events detected during a number, N, of repetitions of the cycle defined by steps (a) to (c), and if $n/N > v_{ref,1}$, wherein, $v_{ref,1}$, is a first control ratio, then the opening time, t1, is prolonged to a time, $t2 = t1 + \Delta t2$, wherein $\Delta t2 > 0$;
(e) Repeat steps (a) to (d) with the values t1 or t2 determined in step (d).

Figure 2:
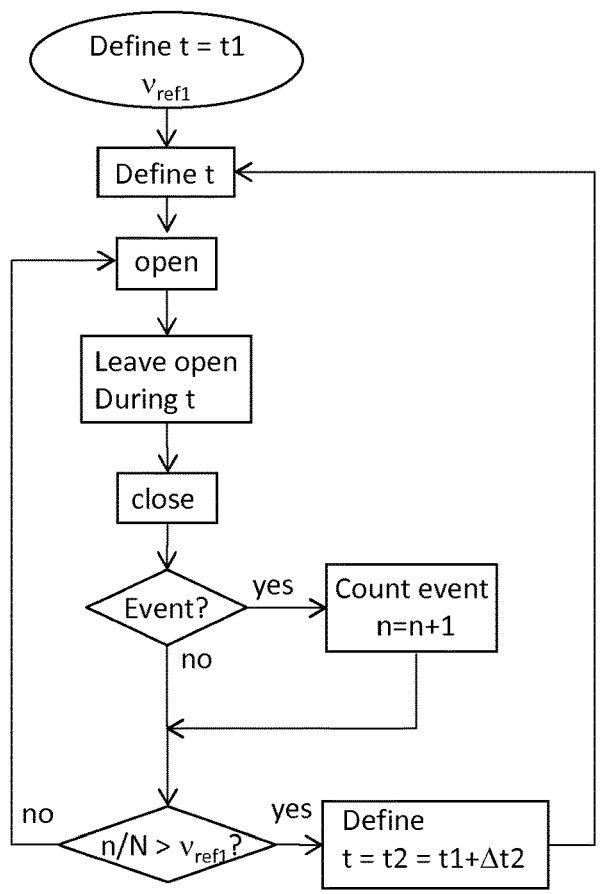
FIG. 2: shows a flowchart illustrating the learning process of an auto-close door according to the present invention.

FIG. 2 shows a flowchart illustrating said operations. After counting the number of events, n, and comparing the ratio, n/N with said first control ratio, $\bullet v_{ref,1}$. In case said ratio is larger than, $\bullet v_{ref,1}$, a longer opening time, $t2 = t1 + \Delta t2$, is defined for the next opening/closing cycle.

It is preferred that,
(i) If $n/N < v_{ref,2}$, wherein, $v_{ref,2}$, is a second control ratio with $v_{ref,2} \leq v_{ref,1}$, then the opening time, t0, is reduced to a time, $t0 = t1 - \Delta t0$, wherein $\Delta t0 > 0$;
(ii) If $\bullet v_{ref,2} \leq n/N \leq v_{ref,1}$, then the opening time, t0, is maintained constant, and In step (e), the cycle defined by steps (a) to (c) is repeated with the values t0, t1, or t2 determined in step (d).

Figure 4:
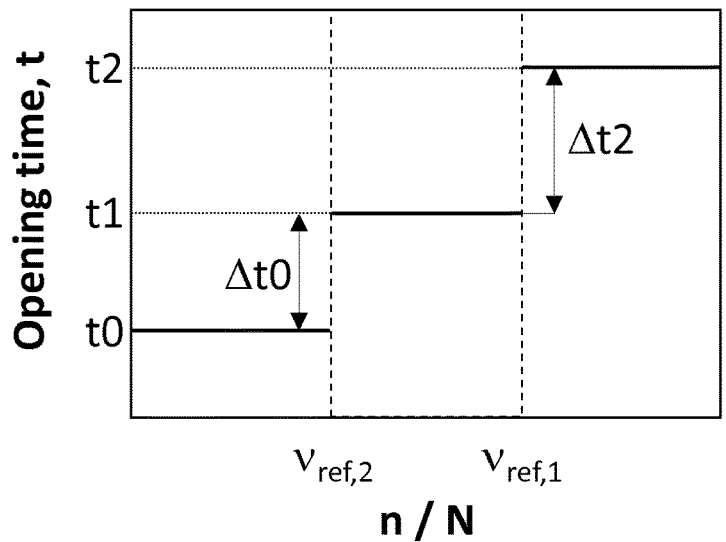
FIG. 4: shows how the opening time varies as a function of the value of the recorded value of events frequency, n/N.
Figure 3:
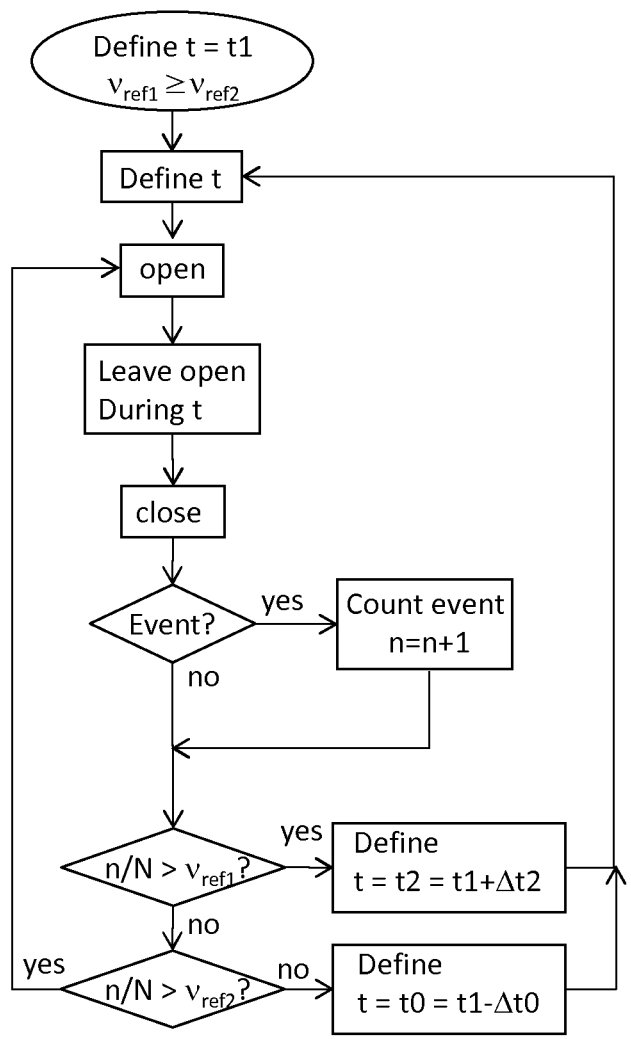
FIG. 3: shows a flowchart illustrating a preferred embodiment of the learning process of an auto-close door according to the present invention.

FIG. 4 illustrates how the opening time is varied as a function of the value of the control ratio, n/N, as it is comprised within or without the range $[v_{ref,2}, \bullet v_{ref,1}]$ in the foregoing embodiment, which is illustrated in the flowchart of FIG. 3. The opening time for the next opening closing cycle is defined as follows:

When the number of events, n/N, falls within the range $[v_{ref,2}, \bullet v_{ref,1}]$, the next cycle is repeated with the same opening time, t1, as used so far.

When the number of events, n/N; is greater than, $v_{ref,1}$, it means that too many incidents (impacts or obstacles detected during closing of the shutter), and the shutter should remain open a longer time. Hence the next opening/closing cycle is carried out with a longer opening time, $t2 > t1$, with $t2 = t1 + \Delta t2$.

Finally, when the number of events, n/N; is smaller than, $v_{ref,2}$, it means that the opening time could be shortened, and the shutter closed more rapidly (allowing saving heating energy in case of a door to the outside). The next opening/closing cycle is thus carried out with a shorter opening time, $t0 < t1$, with $t0 = t1 - \Delta t0$.

The value of the first control ratio, $v_{ref,1}$, can be comprised between 5 and 33%, preferably between 10 and 20%. The value of the second control ratio, $v_{ref,2}$, can be comprised between 1 and 10%, preferably between 2 and 5%, with the condition that $v_{ref,2} < v_{ref,1}$.

Figure 5:
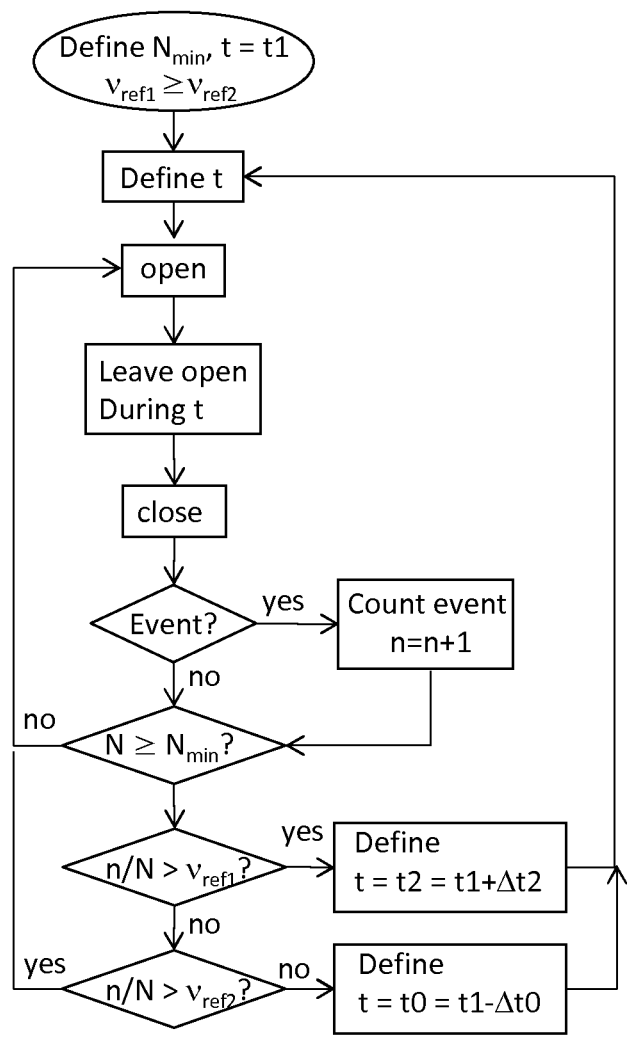
FIG. 5: shows a flowchart illustrating a preferred embodiment of the learning process of an auto-close door according to the present invention.
Figure 6:
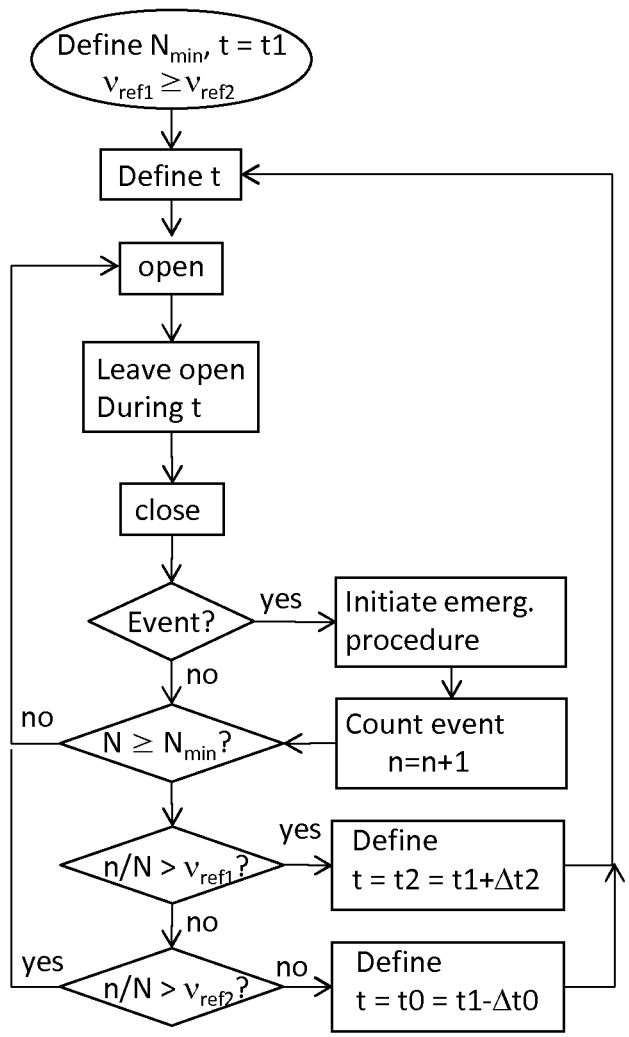
FIG. 6: shows a flowchart illustrating a preferred embodiment of the learning process of an auto-close door according to the present invention.

In order to allow the value of n/N to reach values which are statistically representative of the specific use conditions to which the door is exposed, it is preferred that a statistically representative number, $N_{min}$, of cycle repetitions defined by steps (a) to (c) must be carried out before the opening time is modified in step (e). This additional condition is illustrated in the flowchart of FIGS. 5&6. The statistically representative number of cycle repetitions, $N_{min}$, can be comprised between 1 and 30 cycles, more preferably between 5 and 30 cycles, more preferably between 10 and 20 cycles. A lower number of cycles, $N_{min}$, makes the door more reactive to conditions of use which are likely to change more often. On the other hand, a higher number of cycles, $N_{min}$, is more appropriate to working conditions which are not likely to change much, such that the door will not react instantly and change its opening time at the first unexpected event, such as an accidental impact.

In the embodiment illustrated in FIGS. 3&4, wherein the opening time is reduced in case the events frequency is lower than a second reference ratio, $v_{ref,2}$, the shutter will most likely impact several times an obstacle, since absent any event, the opening time is reduced further until the frequency of events gets higher than the value of the first reference ratio, $v_{ref,1}$. For this reason, it is preferred that upon detection of an obstacle and/or an impacting event, an emergency procedure is initiated as illustrated in the flowchart of FIG. 6. Typically, an emergency procedure comprises: stopping the closing of the shutter and preferably initiating the opening of the shutter to a waiting position, $P_{waiting}$.

For example, if the auto-close door comprises means for monitoring the instantaneous position of the leading edge of the shutter in its closing/opening trajectory in the direction defined by the guiding rails (7), an emergency procedure as proposed in US20120073200 can be applied (for the details of the emergency procedure, the disclosure of US20120073200 is incorporated herein by reference). In particular, if the shutter closes at a speed, v1, an emergency procedure comprising the following steps can be triggered upon detection of an obstacle and/or an impacting event:
(i) stoppage of the motor, and storage of the event position, $P_{event}$, followed by
(ii) opening of the shutter at a speed v2 as far as a waiting position, $P_{waiting}$, predetermined so as to leave sufficient space for removing the obstacle;
(iii) after a waiting time, $\Delta t_{waiting}$, in the waiting position, $P_{waiting}$, opening the shutter again at the speed, v1, as far as a predetermined position, P3, situated upstream of the event position $P_{event}$, at which point the speed of closing is reduced to the value v3, with $0 < v3 < v1$;
(iv) if upon closing the shutter at the reduced speed, v3, no obstacle is detected at the position $P_{event}$, increasing the speed of closing to the value v1 until the shutter reaches a desired final position;
(v) if on the other hand upon closing the shutter at a reduced speed, v3, an obstacle is detected once again at the same position $P_{event}$, the cycle defined by steps (i) to (iii) is repeated and step (iv) is executed if the conditions defined therein are fulfilled;
(vi) if after a predetermined number, $N_{safe}$, of repetitions of said cycle the obstacle is still detected, opening the shutter at speed, v2, and stopping of the shutter at a predetermined stop position $P_{stop}$, until manual reactivation of the control system.

The number of events detected after said predetermined number, $N_{safe}$, of repetitions of said cycle may be taken into account for the determination of the frequency of events, n/N, used to adapt the value of the opening time.

For example for implementing an emergency procedure as described supra, an auto-close door according to the present invention may comprise means for monitoring the instantaneous position of the leading edge of the shutter. For example, such means may be selected among the following:
  Optical device suitable for counting a number of windows aligned along at least one lateral edge of the shutter; or
  Device for counting the number of revolution of the motor driving the opening/closing of the shutter.

An auto-close door according to the present invention is highly advantageous, as it automatically closes a shutter which has been previously opened, after an opening time which varies according to the specific conditions of use of said door. The door is able to adapt the shortest possible opening time adapted to particular conditions of use without any human assistance being required. Furthermore, if the conditions of use of a door vary over time, the door is able to adapt on its own to the new conditions.

Example

The CPU is programmed with the values N, $v_{ref,2}$, $v_{ref,1}$, t1, Δt0, Δt2, listed below:
N=20
$v_{ref,2}$ 5% (=1/20)
$v_{ref,1}$ 25% (=5/20)
t1 15 s
Δt0 3 s
Δt2 5 s Starting with an opening time, t1=15 s, and depending on the number of events, n, detected during N cycles, the opening time in the next cycle ($21^{st}$ cycle) will have the value as indicated below.

| n = | 0 | 1-5 (e.g.; 4) | >5 (e.g. 8) |
|---|---|---|---|
| n/N | $0 < v_{ref,2}$ | $\in [v_{ref,2}, v_{ref,1}]$ (e.g., 20%) | $>v_{ref,1}$ (e.g., 40%) |
| opening time for the next ($21^{st}$) cycle | t0 = t1 − Δt0 = 12 s | t1 = 15 s (unchanged) | t2 = t1 + Δt2 = 20 s |

| REF | DESCRIPTION |
|---|---|
| 1 | shutter |
| 1L | leading edge of shutter |
| 3 | area to be closed and opened |
| 5 | Wave detection cell |
| 6 | impact detector |
| 7 | guiding rail |
| 10 | motorized driving mechanism |
| 11 | rotating drum |
| α | first direction of leading edge displacement to close the area |
| β | second direction of leading edge displacement to open the area |

The invention claimed is:

1. An auto-close door system for closing an area at least partially defined by a frame, said auto-close door comprising:
   (A) a motorized driving mechanism having a motor suitable for moving a leading edge of a shutter in a first direction (α) to close said area defined within said frame and in a second direction (β) to open said area;
   (B) at least one of
      a a wave detection cell suitable for detecting the presence of an obstacle within the area defined by the frame; or
      b an impact detector suitable for detecting an impacting event with the leading edge of the shutter; and
   (C) a processing unit (CPU) programmed to carry out the following operations:
      (a) upon opening the area a first time by moving the leading edge of the shutter in said second direction (β), maintain the area open for an opening time, t1, after which
      (b) close the shutter,
      (c) record whether the obstacle or the impacting event is detected by the wave detector or the impact detector, upon closing the shutter;
      (d) count a number, n, of the obstacles and the impacting events detected during a number, N, of repetitions of the cycle defined by steps (a) to (c), wherein N≥2 and if an event frequency n/N>Vref,1, wherein, Vref,1, is a first control ratio, then the opening time, t1, is prolonged to a time, t2=t1+Δt2, wherein Δt2>0; and
      (e) Repeat steps (a) to (d) with the values t1 or t2 determined in step (d).

2. The auto-close door system according to claim 1, wherein in step (d),
   (i) if n/N<Vref,2, wherein, Vref,2, is a second control ratio with Vref,2≤Vref,1, then the opening time, t1, is reduced to a time, t0=t1−Δt0, wherein Δt0>0; and
   (ii) if Vref,2≤n/N≤Vref, 1, then the opening time, t1, is maintained constant, and in step (e), the cycle defined by steps (a) to (c) is repeated with the values t0, t1 or t2 determined in step (d).

3. The auto-close door system according to claim 1 or 2, wherein a statistically representative number, $N_{min}$, of cycle repetitions defined by steps (a) to (c) must be carried out before the opening time is modified in step (e), and wherein $N_{min}$ is between 10 and 20 cycles.

4. The auto-close door system according to claim 1, wherein upon detection of the obstacle or the impacting event, an emergency procedure is initiated comprising stopping the closing of the shutter and preferably initiating the opening of the shutter to a waiting position $P_{waiting}$.

5. The auto-close door system according to claim 1, wherein the shutter comprises two lateral edges engaged in respective parallel guiding rails defining two sides of the frame, and wherein the leading edge links the two lateral edges, and moves along a direction defined by the guiding rails upon closing and opening the shutter.

6. The auto-close door system according to claim 5, further comprising means for monitoring an instantaneous position of the leading edge of the shutter in a closing and opening trajectory in the direction defined by the guiding rails.

7. The auto-close door system according to claim 6, wherein the shutter closes at a speed, v1, and wherein, upon detection of the obstacle or the impacting event, an emergency procedure comprises the following steps:
   (i) stoppage of the motor, and storage of an event position, $P_{event}$, followed by;
   (ii) opening of the shutter at a speed v2 as far as a waiting position, $P_{waiting}$, predetermined so as to leave sufficient space for removing the obstacle;
   (iii) after a waiting time, $\Delta t_{waiting}$, in the waiting position, $P_{waiting}$, opening the shutter again at the speed, v1, as far as a predetermined position, P3, situated upstream of the event position $P_{event}$, at which point the speed of closing is reduced to a speed v3, with 0<v3<v1;
   (iv) if upon closing the shutter at the reduced speed, v3, no obstacle is detected at the position event, increasing the speed of closing to the speed v1 until the shutter reaches a desired final position;
   (v) if on the other hand upon closing the shutter at the reduced speed, v3, the obstacle is detected once again at the same position $P_{event}$, the cycle defined by steps (i) to (iii) is repeated and step (iv) is executed if the conditions defined therein are fulfilled; and
   (vi) if after a predetermined number, $N_{safe}$, of repetitions of said cycle the obstacle is still detected, opening the shutter at the speed, v2, and stopping of the shutter at a predetermined stop position $P_{stop}$, until manual reactivation of the control system.

8. Auto-close door system according to claim 6, wherein the means for monitoring the instantaneous position of the leading edge of the shutter are selected among the following:
   an optical device suitable for counting a number of windows aligned along at least one lateral of the two later edges of the shutter; and
   a device for counting a number of revolutions of the motor driving of the shutter.

9. The auto-close door system according claim 5, wherein, at least one lateral of the two later edges of the shutter comprises a bead slideably engaged in an opening of a corresponding guiding rail and which can be extracted therefrom under of the parallel guiding rails of a defined pulling force directed transversely to the guiding rail provoked for example by an impact upon closing the shutter, and wherein:
   the auto-close door further comprises a means for reinserting into the guiding rail opening the bead that has been extracted therefrom, the means for reinserting comprising
   a guide member which is positioned facing the guiding rail opening and which is designed so that, while the shutter is being opened, the guide member deflects toward the guiding rail opening the bead that has been extracted from the guiding rail opening,
   wherein the guide member comprises at least one pair of rollers having fixed axes of rotation which are located symmetrically on each side of a mid plane of the shutter, in a plane substantially perpendicular to said mid-plane of the shutter and are directed obliquely with respect to said mid-plane of the shutter so that the at least one pair of rollers converge toward a bottom of the guiding rail opening and roll, as the shutter is moved in the opening direction, along the bead which has been extracted from the guiding rail opening, pushing the bead into the guiding rail opening.

10. The auto-close door system according to claim 1, wherein the shutter and motorized driving mechanism are selected from:
   (a) a flexible shutter wherein the motorized driving mechanism drives a rotation of a drum to move the leading edge in the first direction ($\alpha$) to close the area by unwinding the flexible shutter from said drum, and to move the flexible shutter in the second direction ($\beta$) to open said area by winding the flexible shutter about said drum;
   (b) a deformable shutter comprising panels hinged to one another parallel to the leading edge, wherein the motorized driving mechanism drives the rotation of an axle about which the hinged panels rotate and change direction; or
   (c) a rigid shutter, wherein the motorized driving mechanism drives the rotation of an axle which moves the rigid shutter in a plane of said area in the first and second directions, by means of a gear system, cables, or chains.

11. Method for controlling the time the auto-close door system according to claim 1 remains open before the system is closed, said method comprising the following steps
   (a) upon opening the area the first time by moving the leading edge of the shutter in said second direction ($\beta$), maintain the area open for the opening time, t1, after
   (b) close the shutter,
   (c) record whether the obstacle or the impacting event is detected by the wave detector or the impact detector, upon closing the shutter;
   (d) count the number, n, of the obstacles and the impacting events detected during the number, N, of repetitions of the cycle defined by steps (a) to (c), and if the event frequency n/N>Vref,1, wherein, Vref,1, is the first control ratio, then the opening time, t1, is prolonged to the time, t2=t1+Δ2, wherein Δt2>0;
   (e) Repeat steps (a) to (d) with the values t1 or t2 determined in step (d).

\* \* \* \* \*